(12) United States Patent
Son et al.

(10) Patent No.: US 12,400,903 B2
(45) Date of Patent: Aug. 26, 2025

(54) SUBSTRATE TREATING APPARATUS AND SUBSTRATE TREATING METHOD

(71) Applicant: SEMES CO., LTD., Chungcheongnam-do (KR)

(72) Inventors: Won Sik Son, Gyeonggi-do (KR); Se Hoon Oh, Chungcheongnam-do (KR); Jin Kyu Kim, Gyeonggi-do (KR); In Ki Jung, Gyeonggi-do (KR); Jeong Hyup Yu, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 477 days.

(21) Appl. No.: 17/965,100

(22) Filed: Oct. 13, 2022

(65) Prior Publication Data

US 2023/0120608 A1 Apr. 20, 2023

(30) Foreign Application Priority Data

Oct. 14, 2021 (KR) .................. 10-2021-0136377

(51) Int. Cl.
*H01L 21/687* (2006.01)
*H01L 21/67* (2006.01)
*B05D 1/00* (2006.01)

(52) U.S. Cl.
CPC .. *H01L 21/68728* (2013.01); *H01L 21/67115* (2013.01); *H01L 21/6875* (2013.01); *H01L 21/68785* (2013.01); *B05D 1/005* (2013.01)

(58) Field of Classification Search
CPC ......... H01L 21/68728; H01L 21/68764; H01L 21/68785; H01L 21/67098; H01L 21/67115

See application file for complete search history.

(56) References Cited

U.S. PATENT DOCUMENTS 8,172,646 B2* 5/2012 Feng ............... H01L 21/68728
451/367
2017/0250097 A1 8/2017 Hamada et al.
(Continued)

FOREIGN PATENT DOCUMENTS

JP 2002-057205 A 2/2002
JP 2008-060579 A 3/2008
(Continued)

OTHER PUBLICATIONS

Notice of Reasons for Refusal issued by the Japanese Patent Office on Nov. 21, 2023 in corresponding JP Patent Application No. 2022-163984.
(Continued)

*Primary Examiner* — Tyrone V Hall, Jr.
(74) *Attorney, Agent, or Firm* — Carter, DeLuca & Farrell LLP

(57) ABSTRACT

Provided is an apparatus for treating a substrate including: a processing vessel having a processing space; a support unit for supporting the substrate in the processing space and rotating the substrate; a liquid supply unit for supplying a processing liquid to the substrate; and a heating unit for heating the substrate, wherein the support unit includes: a spin chuck; a driver for rotating the spin chuck; a chuck pin installed on the spin chuck to be rotated together with the spin chuck; and a chuck pin moving unit for moving the chuck pin between a contact position wherein the chuck pin is in contact with a side portion of the substrate and an open position wherein the chuck pin is spaced apart from the side portion of the substrate.

10 Claims, 12 Drawing Sheets

(56) References Cited

U.S. PATENT DOCUMENTS

| | | | |
|---|---|---|---|
| 2019/0096737 A1* | 3/2019 | Abe | ................... H01L 21/67017 |
| 2019/0198363 A1 | 6/2019 | Shimai et al. | |
| 2020/0251358 A1* | 8/2020 | Cha | ................... H01L 21/67115 |
| 2021/0202280 A1 | 7/2021 | Kim et al. | |

FOREIGN PATENT DOCUMENTS

| | | |
|---|---|---|
| JP | 2014-157936 A | 8/2014 |
| JP | 2016-192545 A | 11/2016 |
| JP | 2017-152686 A | 8/2017 |
| JP | 2018-019103 A | 2/2018 |
| JP | 2018-050014 A | 3/2018 |
| JP | 2020-047719 A | 3/2020 |
| JP | 2021-106237 A | 7/2021 |
| JP | 2021-106257 A | 7/2021 |
| KR | 10-1145775 B1 | 5/2012 |
| KR | 10-1445775 B1 | 10/2014 |
| KR | 10-2020-0122486 A | 10/2020 |
| KR | 10-2208753 B1 | 1/2021 |
| KR | 10-2248770 B1 | 5/2021 |
| KR | 10-2021-0083092 A | 7/2021 |

OTHER PUBLICATIONS

Korean Office Action issued in corresponding KR Patent Application No. 10-2021-0136377, dated Feb. 21, 2025, with English translation.

\* cited by examiner

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0136377 filed in the Korean Intellectual Property Office on Oct. 14, 2021, the entire contents of which are incorporated herein by reference.

TECHNICAL FIELD

The present invention relates to a substrate treating apparatus and a substrate treating method.

BACKGROUND ART

In order to manufacture a semiconductor device or a liquid crystal display, various processes, such as photography, ashing, ion implantation, thin film deposition, and cleaning, performed on a substrate. Among them, the etching process or the cleaning process is a process of removing unnecessary regions of a thin film formed on a substrate, or etching or cleaning foreign substances, particles, and the like, and requires high selectivity, high etch rate, and etch uniformity for the thin film, and as semiconductor devices are highly integrated, higher levels of etch selectivity and etch uniformity are required.

In general, in the etching process or cleaning process of the substrate, a processing liquid treatment operation, a rinse treatment operation, and a drying treatment operation are sequentially performed. In one example, in the processing liquid treatment operation, a processing liquid for etching the thin film formed on the substrate or removing foreign substances on the substrate is supplied to the substrate to form a puddle, and then the puddle of the processing liquid is heated to promote the etching by the processing liquid, and in the rinse treatment operation, a rinse liquid, such as pure water, is supplied onto the substrate.

The above-described processing liquid treatment operation is performed by placing the substrate on a support unit and supplying the processing liquid onto the substrate while rotating the support unit. The support unit is provided with chuck pins for supporting the side portion of the substrate to prevent the substrate from moving in the lateral direction of the support unit during rotation. The chuck pins move between a standby position that provides space for a substrate to be placed when the substrate is loaded or unloaded onto the support unit, and a support position that comes into contact with the side portion of the substrate as the process is performed while the substrate placed on the support unit is rotated. Accordingly, the space provided between the chuck pins placed in the standby position is wider than the space provided between the chuck pins placed in the support position.

In general, when the puddle is formed on the substrate, a problem occurs in that the processing liquid flows down along the chuck pin due to the contact between the substrate and the chuck pin. In addition, there is a problem in that it is difficult to maintain a certain amount of liquid film due to the phenomenon in which the processing liquid flows down along the chuck pin.

SUMMARY OF THE INVENTION

The present invention has been made in an effort to provide a substrate treating apparatus and a substrate treating method capable of efficiently treating a substrate.

The present invention has also been made in an effort to provide a support unit in which a chuck pin freely moves during a process by rotating a substrate, and a substrate treating apparatus and method using the same.

The object of the present invention is not limited thereto, and other objects not mentioned will be clearly understood by those of ordinary skill in the art from the following description.

An exemplary embodiment of the present invention provides an apparatus for treating a substrate, the apparatus including: a processing vessel having a processing space; a support unit for supporting the substrate in the processing space and rotating the substrate; a liquid supply unit for supplying a processing liquid to the substrate supported by the support unit; and a heating unit for heating the substrate, in which the support unit includes: a spin chuck; a driver for rotating the spin chuck; a chuck pin installed on the spin chuck so as to be rotated together with the spin chuck; and a chuck pin moving unit for moving the chuck pin between a contact position in which the chuck pin is in contact with a side portion of the substrate and an open position in which the chuck pin is spaced apart from the side portion of the substrate, the chuck pin moving unit includes: a first driving module coupled to the chuck pin and rotated together with the spin chuck; and a second driving module which faces the first driving module and is not rotated together with the spin chuck, the first driving module includes a first magnetic body, and the second driving module includes a second magnetic body facing the first magnetic body, and a driving member for driving the second magnetic body in a vertical direction.

The first driving module may move a position of the chuck pin according to a change in a position of the second magnetic body.

Repulsive force may act between the first magnetic body and the second magnetic body.

The first driving module may further include an arm member connecting the first magnetic body and the chuck pin, and the arm member may guide the movement of the chuck pin as the first magnetic body moves.

The chuck pin may include a plurality of chuck pins, the second magnetic body may be provided in a ring shape, and the first driving module may be provided in a number corresponding to the plurality of chuck pins.

The arm member may include: a first arm coupled to the chuck pin and extending in a direction perpendicular to a longitudinal direction of the chuck pin; a second arm coupled to the first arm; and a third arm for connecting the second arm and the first magnetic body, an elastic member may be coupled to one end of the second arm, and the elastic member may provide recovery force so that the chuck pin is moved from the open position to the contact position.

The chuck pin moving unit may move the chuck pin while the spin chuck is rotating.

The driver may rotate the spin chuck so that the substrate is rotated at a first speed, and the chuck pin moving unit may move the chuck pin so that the chuck pin is positioned at the open position while the substrate is rotating at the first speed.

The driver may rotate the spin chuck so that the substrate is rotated at a second speed faster than the first speed, and the chuck pin moving unit may move the chuck pin so that the chuck pin is positioned at the contact position while the substrate is rotating at the second speed.

The spin chuck may have a through-hole penetrating in a vertical direction, and the heating unit may heat a bottom surface of the substrate through the through-hole.

The heating unit may include a laser.

The spin chuck may include: a body portion; and an extension portion extending upwardly from an upper end of the body portion, and an area of the extension portion may gradually increase toward the top.

Another exemplary embodiment of the present invention provides a method of treating a substrate, the method including: a first liquid supply operation of supplying a first liquid to a substrate rotating at a first speed in an open state in which a chuck pin provided to support a side portion of the substrate is spaced apart from the side portion of the substrate and forming a first liquid film on the substrate; a liquid film heating operation of heating the first liquid film formed on the substrate in the open state, after the first liquid supply operation; and a second liquid supply operation of supplying a second liquid to the substrate rotating at a second speed in a contact state in which the chuck pin is in contact with the side portion of the substrate to support the side portion of the substrate, after the liquid film heating operation.

The first liquid and the second liquid may be the same.

The first liquid may be an aqueous solution of phosphoric acid.

The change from the open state to the contact state may be made while the substrate is rotating.

The second speed may be faster than the first speed.

The amount of second liquid supplied per unit time in the second liquid supply operation may be greater than the amount of first liquid supplied per unit time in the first liquid supply operation.

In the liquid film heating operation, the substrate may be rotated at the first speed, and the first liquid may not be supplied onto the substrate.

Still another exemplary embodiment of the present invention provides a method of treating a substrate by using the apparatus of treating the substrate, the method including: a first liquid supply operation of supplying a first liquid to the substrate rotating at a first speed in an open state in which the chuck pin is positioned at the open position to form a first liquid film on the substrate; a liquid film heating operation of heating the first liquid film formed on the substrate in the open state of the chuck pin, after the first liquid supply operation; and a second liquid supply operation of supplying a second liquid to the substrate rotating at a second speed faster than the first speed in a contact state in which the chuck pin is positioned at the contact position, after the liquid film heating operation, in which the change of the chuck pin from the open state to the contact state is performed while the substrate is rotating.

According to the exemplary embodiment of the present invention, it is possible to efficiently treat a substrate.

Further, according to the exemplary embodiment of the present invention, the chuck pin may be freely moved while the process is performed by rotating the substrate.

Further, according to the exemplary embodiment of the present invention, it is possible to prevent the processing liquid from flowing down to the chuck pin.

Further, according to the exemplary embodiment of the present invention, the processing liquid puddle formed on the substrate may be maintained as a liquid film of a predetermined amount or more.

Further, according to the exemplary embodiment of the present invention, the chuck pin may be constantly moved regardless of whether the support unit supporting the substrate is rotated or is not rotated.

Further, according to the exemplary embodiment of the present invention, it is possible to adjust the movement stroke of the chuck pin during the process.

Further, according to the exemplary embodiment of the present invention, through the support unit in which a hollow space is formed, it is possible to apply various types of heat sources and cooling systems of various heat sources.

The effect of the present invention is not limited to the foregoing effects, and those skilled in the art may clearly understand non-mentioned effects from the present specification and the accompanying drawings.

DETAILED DESCRIPTION

Figure 1:
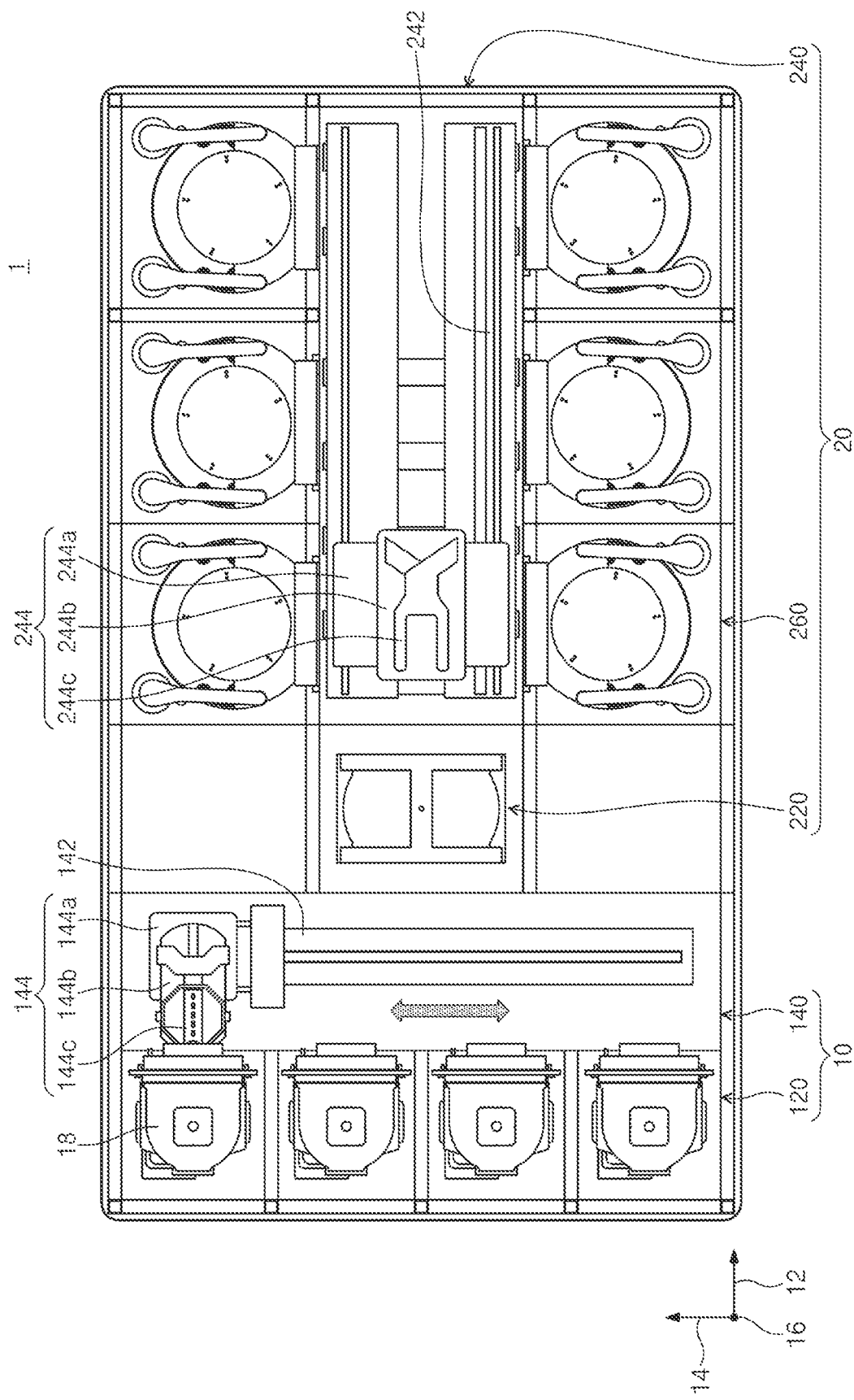
FIG. 1 is a top plan view illustrating a substrate treating facility according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

In addition, unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

An expression, "and/or" includes each of the mentioned items and all of the combinations including one or more of the items. Further, in the present specification, "connected" means not only when member A and member B are directly connected, but also when member A and member B are indirectly connected by interposing member C between member A and member B.

The exemplary embodiment of the present invention may be modified in various forms, and the scope of the present invention should not be construed as being limited to the following exemplary embodiments. The present exemplary embodiment is provided to more completely explain the present invention to those skilled in the art. Therefore, the shapes of elements in the drawings are exaggerated to emphasize clearer descriptions.

In the present exemplary embodiment, a process of etching a substrate by using a processing liquid will be described as an example. However, the present exemplary embodiment is not limited to the etching process, and is variously applicable to substrate treating processes using liquids, such as a cleaning process, an ashing process, and a developing process.

Here, the substrate is a comprehensive concept including all substrates used for manufacturing semiconductor devices, Flat Panel Displays (FPDs), and other articles in which circuit patterns are formed on thin films. Examples of the substrate W include a silicon wafer, a glass substrate, and an organic substrate.

Hereinafter, an example of the present invention will be described in detail with reference to FIGS. 1 to 14.

FIG. 1 is a top plan view illustrating a substrate treating facility 1 according to an exemplary embodiment of the present invention. Referring to FIG. 1, the substrate treating facility 1 includes an index module 10 and a process processing module 20. The index module 10 includes a load port 120 and a transfer frame 140. The load port 120, the transfer frame 140, and the process processing module 20 may be sequentially arranged in series.

Hereinafter, a direction in which the load port 120, the transfer frame 140, and the process processing module 20 are arranged is called to as a first direction 12, and a direction perpendicular to the first direction 12 when viewed from the top is called a second direction 14, and a direction perpendicular to a plane including the first direction 12 and the second direction 14 is called a third direction 16.

A carrier 18 in which a substrate W is accommodated is seated on the load port 120. The load port 120 is provided in plurality, and the plurality of load ports 120 is arranged in series in the second direction 14. The number of load ports 120 may be increased or decreased according to process efficiency of the process processing module 20 and a condition of foot print, and the like. A plurality of slots (not illustrated) for accommodating the plurality of substrates W in a state where the substrates W are arranged horizontally with respect to the ground may be formed in the carrier 18. As the carrier 18, a Front Opening Unified Pod (FOUP) may be used.

The process module 20 includes a buffer unit 220, a transfer chamber 240, and a process chamber 260.

The transfer chamber 240 is disposed so that a longitudinal direction thereof is parallel to the first direction 12. A plurality of process chambers 260 may be disposed on one or both sides of the transfer chamber 240. At one side and the other side of the transfer chamber 240, the plurality of process chambers 260 may be provided to be symmetrical with respect to the transfer chamber 240. Some of the plurality of process chambers 260 are disposed along the longitudinal direction of the transfer chamber 240. Further, some of the process chambers 260 are disposed to be stacked with each other. That is, the plurality of process chambers 260 may be disposed in an arrangement of A×B at one side of the transfer chamber 240. Here, A is the number of process chambers 260 provided in a line along the first direction 12, and B is the number of process chambers 260 provided in a line along the third direction 16. When four or six process chambers 260 are provided at one side of the transfer chamber 240, the process chambers 260 may be disposed in an arrangement of 2×2 or 3×2. The number of process chambers 260 may be increased or decreased. Unlike the foregoing, the process chamber 260 may be provided only to one side of the transfer chamber 240. In addition, the process chamber 260 may be provided as a single layer on one side and both sides of the transfer chamber 240.

The buffer unit 220 is disposed between the transfer frame 140 and the transfer chamber 240. The buffer unit 220 provides a space in which the substrate W stays before the substrate W is transferred between the transfer chamber 240 and the transfer frame 140. A slot (not illustrated) in which the substrate W is placed is provided inside the buffer unit 220. A plurality of slots (not illustrated) is provided so as to be spaced apart from each other in the third direction 16. The buffer unit 220 has an open side facing the transfer frame 140. The buffer unit 220 has an open side facing the transfer chamber 240.

The transfer frame 1400 transfers the substrate W between the carrier 18 seated on the load port 1200 and the buffer unit 220. In the transfer frame 140, an index rail 142 and an index robot 144 are provided. A longitudinal direction of the index rail 142 is provided to be parallel to the second direction 14. The index robot 144 is installed on the index rail 142, and linearly moves in the second direction 14 along the index rail 142. The index robot 144 includes a base 144a, a body 144b, and an index arm 144c. The base 144a is installed to be movable along the index rail 142. The body 144b is coupled to the base 144a. The body 144b is provided to be movable in the third direction 16 on the base 144a. Further, the body 144b is provided to be rotatable on the base 144a. The index arm 144c is coupled to the body 144b and is provided to be movable forwardly and backwardly with respect to the body 144b. A plurality of index arms 144c is provided to be individually driven. The index arms 144c are disposed to be stacked in the state of being spaced apart from each other in the third direction 16. A part of the index arms 144c may be used when the substrate W is transferred from the process processing module 20 to the carrier 18, and another part of the plurality of index arms 144c may be used when the substrate W is transferred from the carrier 18 to the process processing module 20. This may prevent particles generated from the substrate W before the process processing from being attached to the substrate W after the process processing in the process of loading and unloading the substrate W by the index robot 144.

The transfer chamber 2400 transfers the substrate W between the buffer unit 2200 and the process chamber 260, and between the process chambers 260. A guide rail 242 and a main robot 244 are provided to the transfer chamber 240. The guide rail 242 is disposed so that its longitudinal direction is parallel to the first direction 12. The main robot 244 is installed on the guide rail 242 and linearly moved along the first direction 12 on the guide rail 242. The main robot 244 includes a base 244a, a body 244b, and a main arm 244c. The base 244a is installed to be movable along the guide rail 242. The body 244b is coupled to the base 244a. The body 244b is provided to be movable in the third direction 16 on the base 244a. Further, the body 244b is provided to be rotatable on the base 244a. The main arm 244c is coupled to the body 244b, and provided to be movable forwardly and backwardly with respect to the body 244b. A plurality of main arms 244c is provided to be individually driven. The main arms 244 are disposed to be stacked in the state of being spaced apart from each other in the third direction 16.

A substrate treating apparatus 300 performing a liquid processing process on the substrate W is provided to the process chamber 260. The substrate treating apparatus 300 may have a different structure depending on the type of liquid processing process to be performed. Contrary to this, the substrate treating apparatus 300 within each process chamber 260 may have the same structure. Optionally, the plurality of process chambers 260 is divided into a plurality of groups, and the substrate treating apparatuses 300 within the process chambers 260 belong to the same group may have the same structure, and the substrate treating apparatuses 300 within the process chambers 260 belong to the different groups may have the different structures.

Figure 2:
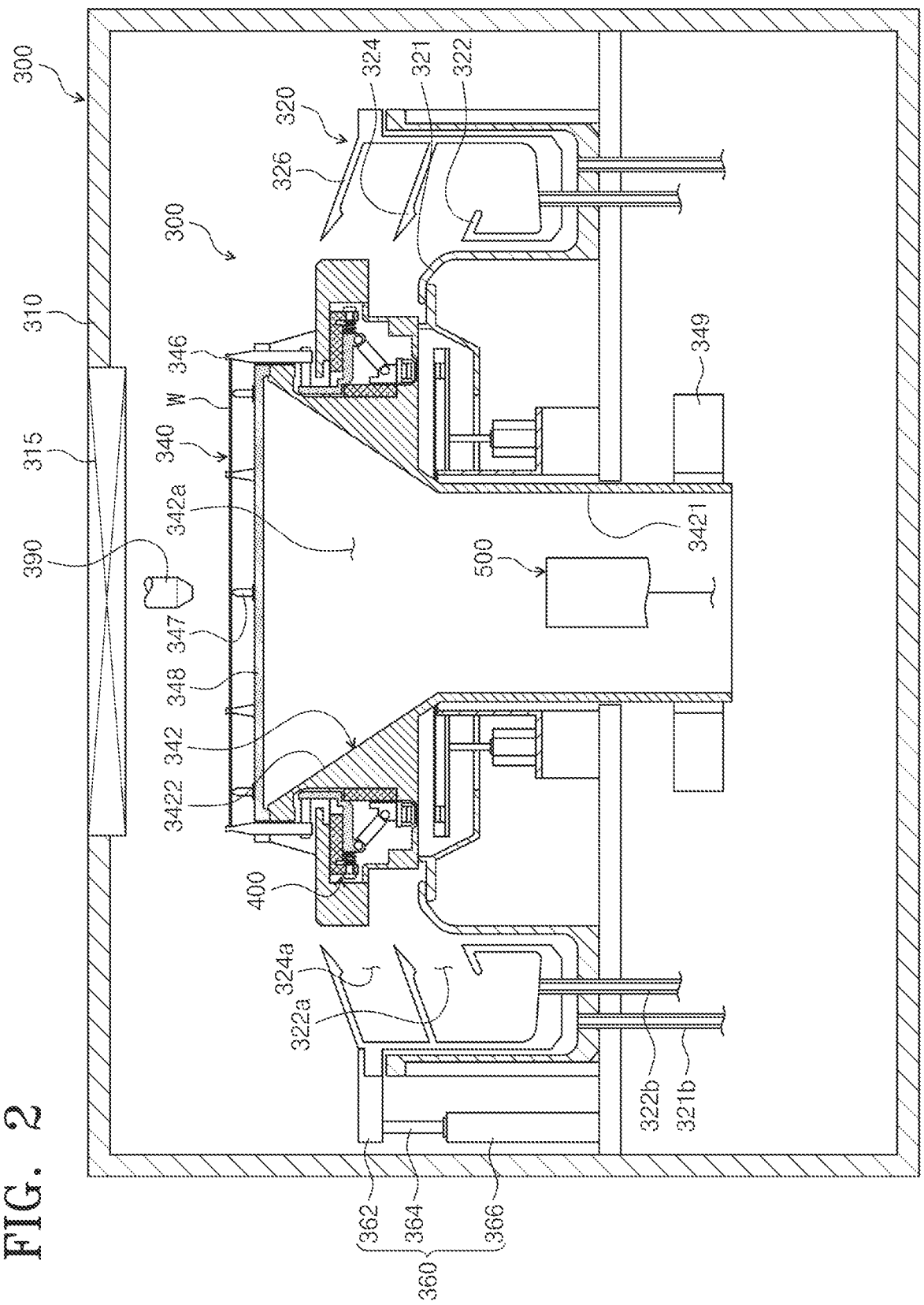
FIG. 2 is a cross-sectional view illustrating a substrate treating apparatus provided in a process chamber of FIG. 1.
Figure 3:
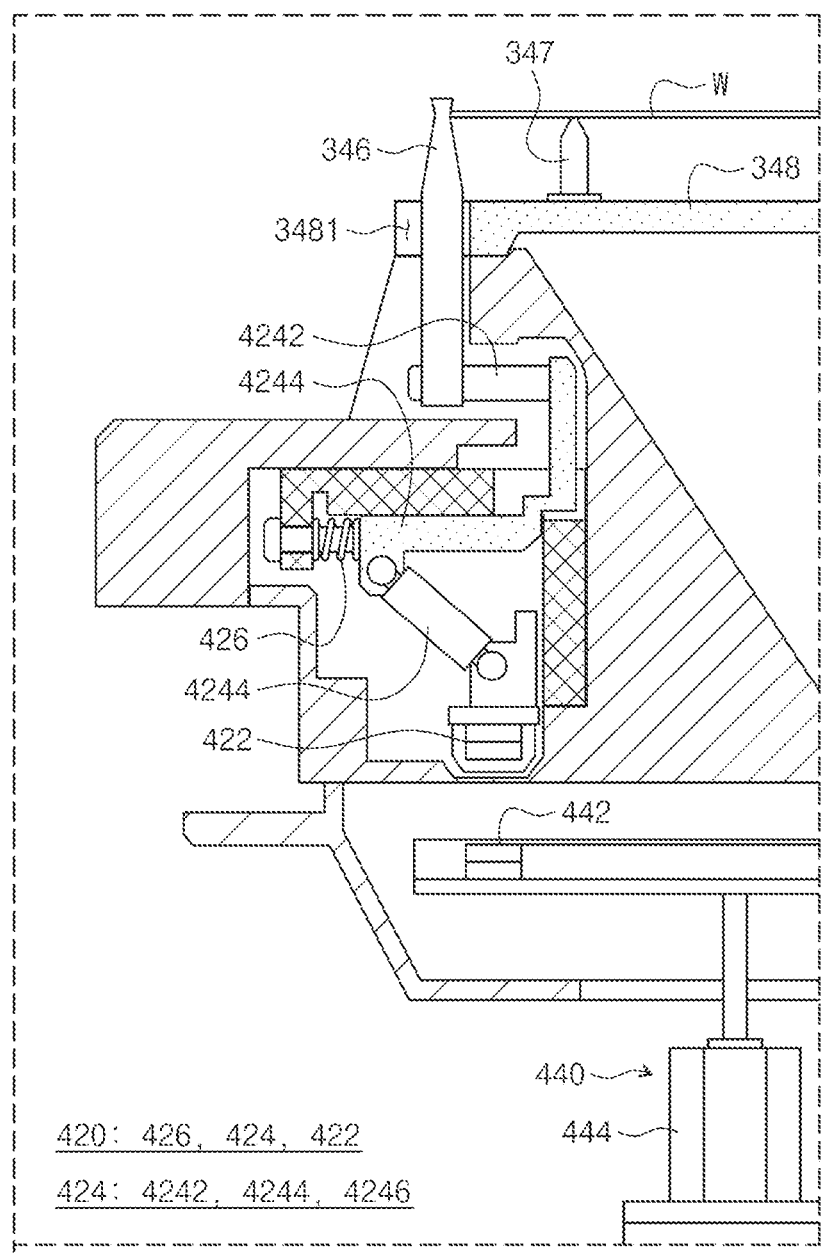
FIG. 3 is a cross-sectional view illustrating a chuck pin and a chuck pin moving unit according to an exemplary embodiment of the present invention.
Figure 4:
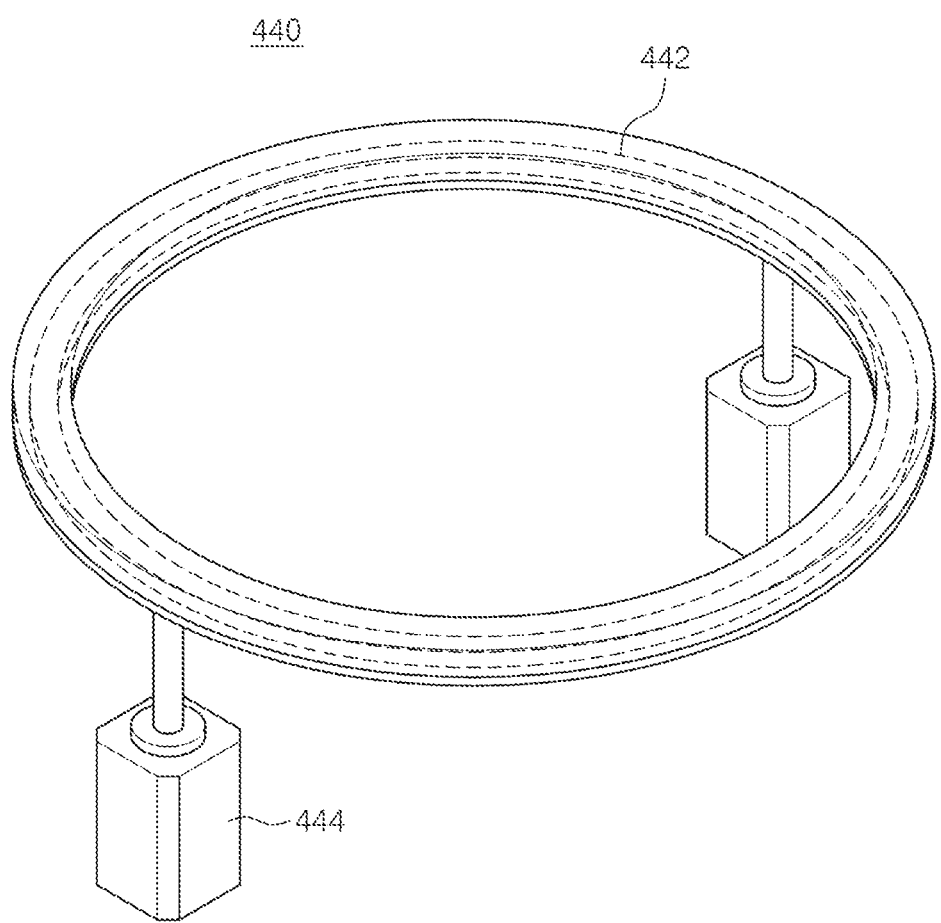
FIG. 4 is a perspective view illustrating a second magnetic body of the chuck pin moving unit of FIG. 3.
Figure 5:
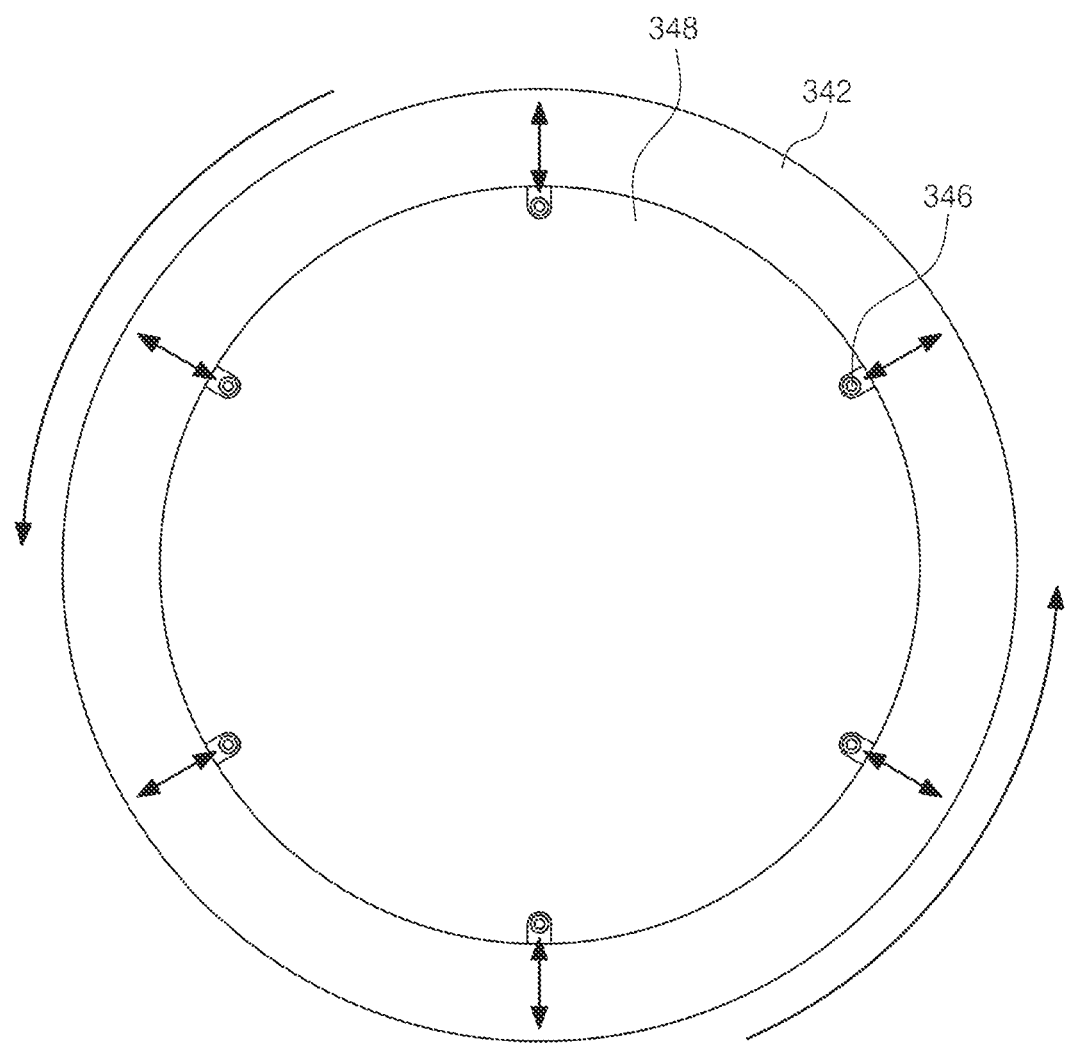
FIG. 5 is a top plan view illustrating a state in which the chuck pin is moved during rotation of a spin chuck according to the exemplary embodiment of the present invention.
Figure 6:
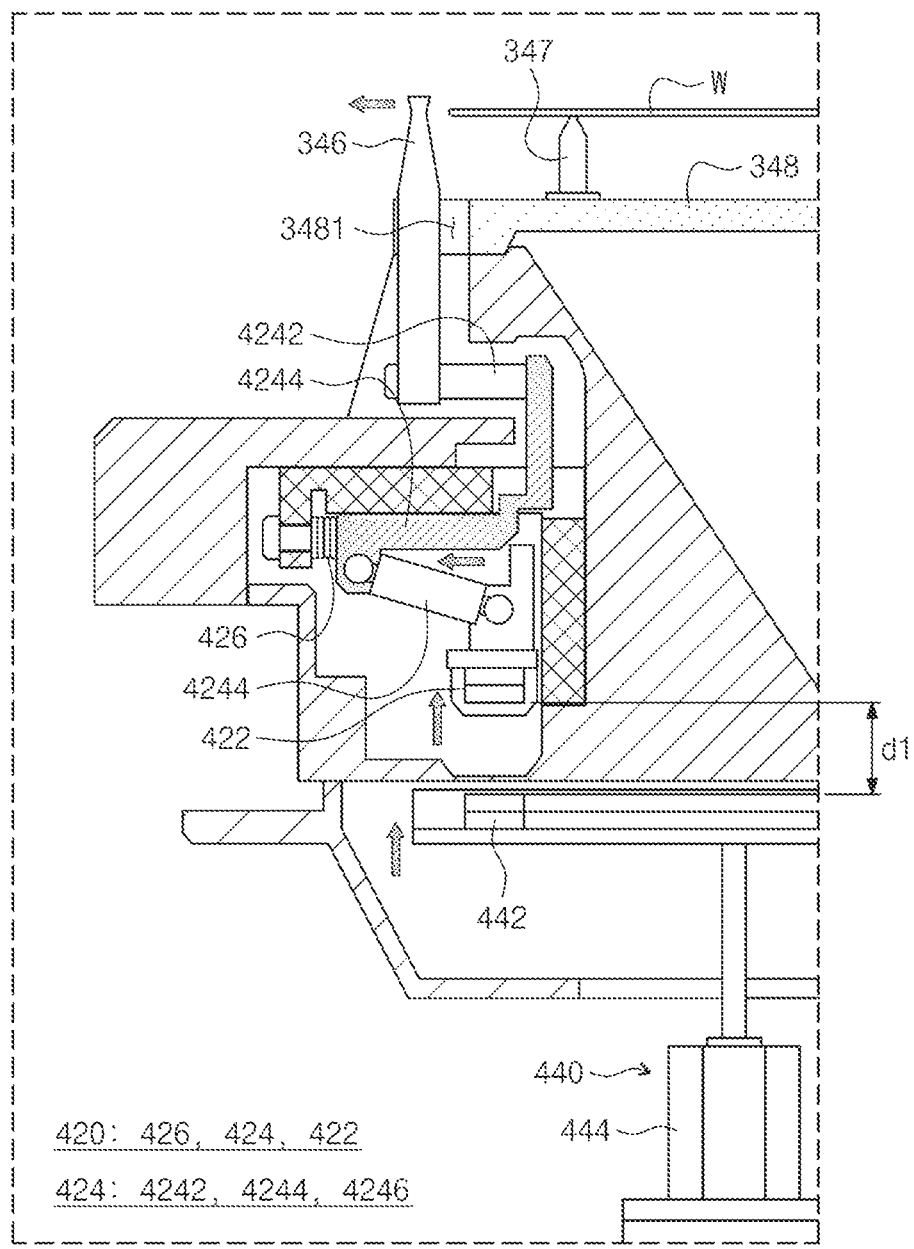
FIG. 6 is an operational view illustrating a process in which the chuck pin of FIG. 5 is moved to an open position.
Figure 7:
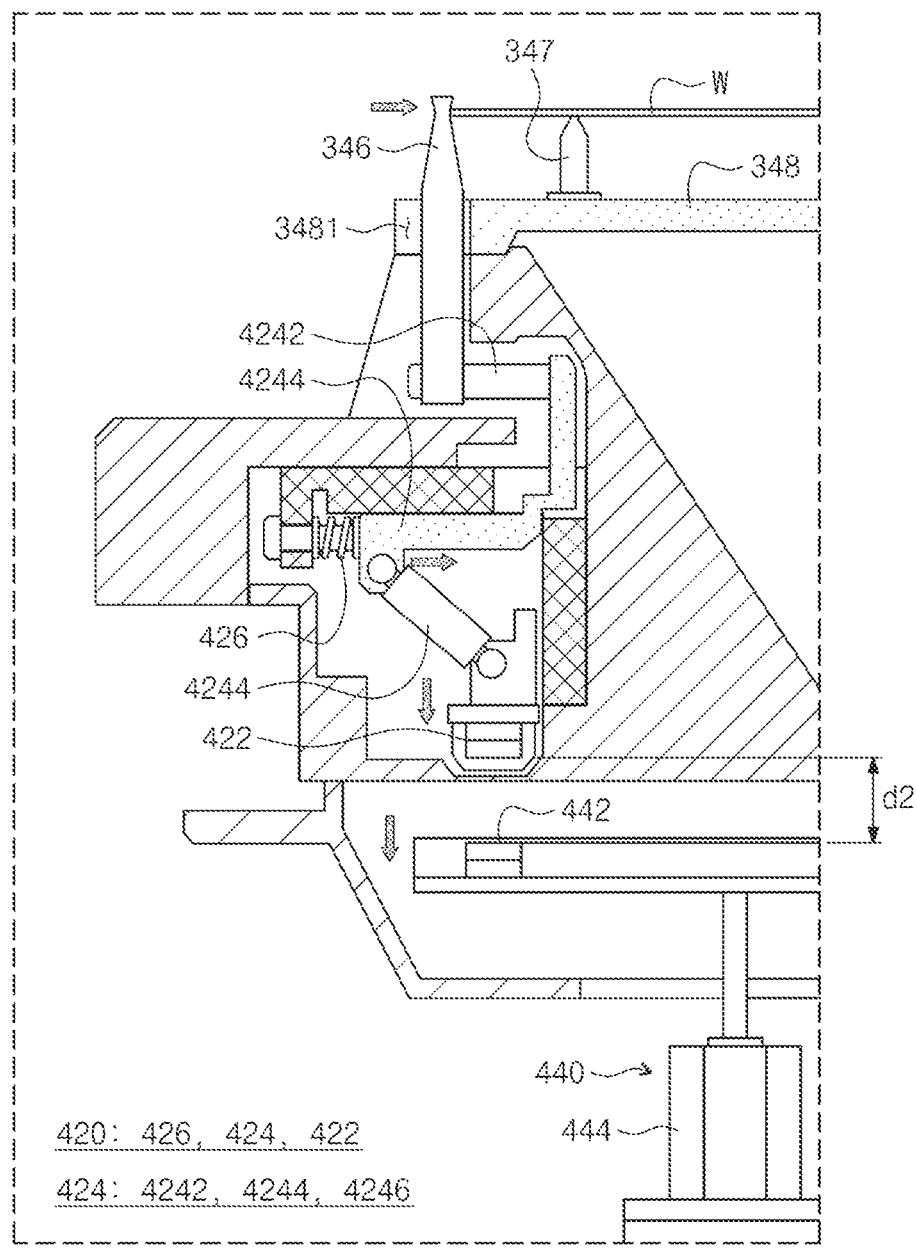
FIG. 7 is an operational view illustrating a process in which the chuck pin of FIG. 5 is moved to a contact position.
Figure 8:
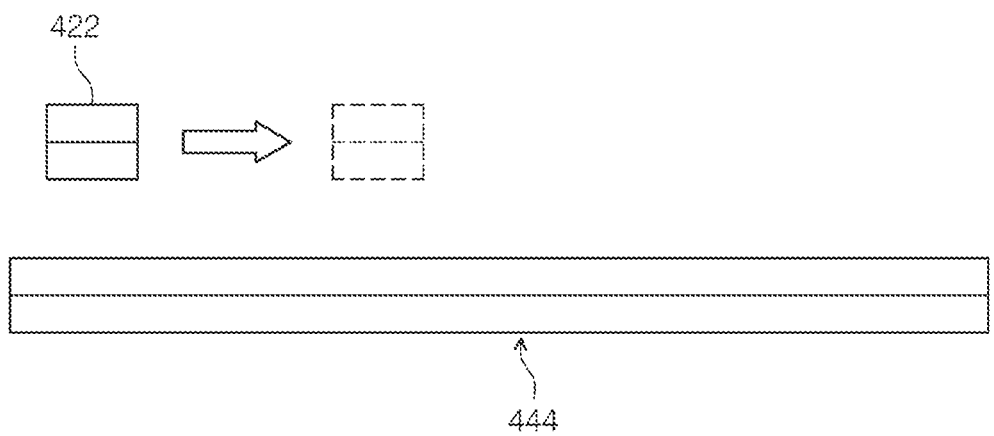
FIG. 8 is a diagram schematically illustrating a relationship between a rotating first magnetic body and a non-rotating second magnetic body of FIG. 4.

FIG. 2 is a cross-sectional view illustrating a substrate treating apparatus provided in a process chamber of FIG. 1, FIG. 3 is a cross-sectional view illustrating a chuck pin and a chuck pin moving unit according to an exemplary embodiment of the present invention, FIG. 4 is a perspective view illustrating a second magnetic body of the chuck pin moving unit of FIG. 3, FIG. 5 is a top plan view illustrating a state in which the chuck pin is moved during rotation of a spin chuck according to the exemplary embodiment of the present invention, FIG. 6 is an operational view illustrating a process in which the chuck pin of FIG. 5 is moved to an open position, FIG. 7 is an operational view illustrating a process in which the chuck pin of FIG. 5 is moved to a contact position, and FIG. 8 is a diagram schematically illustrating a relationship between a rotating first magnetic body and a non-rotating second magnetic body of FIG. 4.

Referring to FIG. 2, the substrate treating apparatus 300 includes a processing vessel 320, a substrate support unit 340, a lifting unit 360, a liquid supply unit 390, and a heating unit 500.

The substrate treating apparatus 300 may include a chamber 310. The chamber 310 provides a sealed inner space. The processing vessel 320 is disposed in the inner space of the chamber 310. A fan filter unit 315 is installed at the upper portion of the chamber 310. The fan filter unit 315 generates a vertical airflow in the chamber 310. The fan filter unit 315 generates a downward airflow in the chamber 310. The fan filter unit 315 is a device in which a filter and an air supply fan are modularized as one unit, and which filters high-humidity outdoor air and supplies the filtered air to the inside of the chamber 310. The high-humidity outdoor air passes through the fan filter unit 315 and is supplied into the chamber 310, and forms a vertical airflow in the inner space of the chamber 310. This vertical airflow provides a uniform airflow in the upper portion of the substrate W. Contaminants (for example, fumes) generated in the process of treating the substrate W are discharged to the outside of the processing vessel 320 together with the air included in the vertical airflow, and through this, the inside of the processing vessel 320 may maintain a high degree of cleanliness.

The treating vessel 320 has a cylindrical shape with an open top. The processing vessel 320 includes a first recovery container 321 and a second recovery container 322. The recovery containers 321 and 322 recovers different processing liquids among the processing liquids used for the process. The first recovery container 321 is provided in an annular ring shape surrounding the substrate support unit 340. The second recovery container 322 is provided in the shape of an annular ring surrounding the substrate support unit 340. In one exemplary embodiment, the first recovery container 321 is provided in an annular ring shape surrounding the second recovery container 322. The second recovery container 322 may be provided by being inserted into the first recovery container 321. The height of the second recovery container 322 may be higher than the height of the first recovery container 321. The second recovery container 322 may include a first guard part 326 and a second guard part 324. The first guard part 326 may be provided at the top of the second recovery container 322. The first guard part 326 is formed to extend toward the substrate support unit 340, and the first guard part 326 may be formed to be inclined upward toward the substrate support unit 340. In the second recovery container 322, the second guard part 324 may be provided at a position spaced downward from the first guard part 326. The second guard part 324 is formed to extend toward the substrate support unit 340, and the second guard part 324 may be formed to be inclined upward toward the substrate support unit 340. The space between the first guard part 326 and the second guard part 324 functions as a first inlet 324a through which the processing liquid flows. A second inlet 322a is provided at a lower portion of the second guard part 324. The first inlet 324a and the second inlet 322a may be located at different heights. A hole (not illustrated) is formed in the second guard part 324 so that the processing liquid flowing into the first inlet 324a flows into a second recovery line 322b provided in the lower portion of the second recovery container 322. A hole (not illustrated) of the second guard part 324 may be formed at a position with the lowest height in the second guard part 324. The processing liquid recovered to the first recovery container 321 is configured to flow into the first recovery line 321b connected to the bottom surface of the first recovery container 321. The processing liquids introduced into the recovery containers 321 and 322 may be provided to an external processing liquid recycling system (not illustrated) through the recovery lines 321b and 322b, respectively, to be re-used.

The lifting unit 360 linearly moves the processing vessel 320 up and down. As an example, the lifting unit 360 is coupled to the second recovery container 322 of the processing vessel 320 and moves the second recovery container 322 up and down, so that the relative height of the processing vessel 320 with respect to the substrate support unit 340 may be changed. The lifting unit 360 includes a bracket 362, a moving shaft 364, and a driver 366. The bracket 362 is fixedly installed on the outer wall of the processing vessel 320, and a moving shaft 364, which is moved in the vertical direction by the driver 366, is fixedly coupled to the bracket 362. The second recovery container 322 of the processing vessel 320 is lowered so that the upper portion of the substrate support unit 340 protrudes toward the upper portion of the processing vessel 320, specifically, protrudes higher than the first guard part 326 when the substrate W is loaded into the substrate support unit 340 or unloaded from the substrate support unit 340. Further, when the process proceeds, the height of the treating vessel 320 is adjusted so that the processing liquid is introduced into the predetermined recovery container 321 and 322 depending on the type of the processing liquid supplied to the substrate W.

Optionally, the lifting unit 360 may also move the substrate support unit 340 in the vertical direction instead of the processing vessel 320. Optionally, the lifting unit 360 may move the entire processing vessel 320 to be movable up and down in the vertical direction. The lifting unit 360 is provided to adjust the relative heights of the processing vessel 320 and the substrate support unit 340, and if it is a configuration capable of adjusting the relative heights of the processing vessel 320 and the substrate support unit 340, exemplary embodiments of the processing vessel 320 and the lifting unit 360 may be provided in various structures and methods depending on the design.

The liquid supply unit 390 is configured to discharge a chemical liquid from an upper portion of the substrate W to the substrate W, and may include one or more chemical liquid discharge nozzles. The liquid supply unit 390 may pump the chemical liquid stored in a storage tank (not illustrated) to discharge the chemical liquid to the substrate W through the chemical liquid discharge nozzle. The liquid supply unit 390 may include a driving unit (not illustrated) to be movable between a process position facing the central region of the substrate W and a standby position outside the substrate W.

The chemical liquid supplied from the liquid supply unit 390 to the substrate W may be various depending on the substrate treatment process. When the substrate treatment process is a silicon nitride film etching process, the chemical liquid may be a chemical liquid including phosphoric acid ($H_3PO_4$). The liquid supply unit 390 may further include a deionized water (DIW) supply nozzle for rinsing the surface of the substrate after the etching process, and an isopropyl alcohol (IPA) discharge nozzle and a nitrogen ($N_2$) discharge nozzle for performing a drying process after rinsing. Although not illustrated, the liquid supply unit 390 may include a nozzle moving member (not illustrated) which is capable of supporting the chemical liquid discharge nozzle and moving the chemical liquid discharge nozzle. The nozzle moving member (not illustrated) may include a support shaft (not illustrated), an arm (not illustrated), and a driver (not illustrated). The support shaft (not illustrated) is located at one side of the treating vessel 320. The support shaft (not illustrated) includes a rod shape of which a longitudinal direction faces the third direction. The support shaft (not illustrated) is provided to be rotatable by the driver (not illustrated). The arm (not illustrated) is coupled to an upper end of the support shaft (not illustrated). The arm (not illustrated) may be extended vertically from the support shaft (not illustrated). The chemical liquid discharge nozzle is fixedly coupled to the distal end of the arm (not illustrated). According to the rotation of the support shaft (not illustrated), the chemical liquid discharge nozzle is capable of swing together with the arm (not illustrated). The chemical liquid discharge nozzle may be swing-moved to move to the process position and the standby position. Optionally, the support shaft (not illustrated) may be provided to be movable up and down. Further, the arm (not illustrated) may be provided to be movable forward and backward toward the longitudinal direction thereof.

The substrate support unit 340 supports the substrate W and rotates the substrate W during the process progress. The substrate support unit 340 includes a spin chuck 342, a window member 348, a driving member 349, a chuck pin 346, and a chuck pin moving unit 400.

The chuck pin 346 is coupled to the spin chuck 342. The substrate W is spaced apart from the upper surface of the spin chuck 342 by the chuck pin 346 coupled to the spin chuck 342. The substrate W is rotated together with the spin chuck 342 while being supported by the chuck pin 346 coupled to the spin chuck 342.

The spin chuck 342 is provided in the shape of a tank having an open top and an open bottom. The spin chuck 342 includes a through-hole 342a penetrating through the upper surface and the lower surface. The spin chuck 342 includes the through-hole 342a penetrating in the vertical direction. In this case, the vertical direction may refer to an axial direction of the spin chuck 342 or a direction parallel to a rotational axis direction of the spin chuck 342. The heating unit 500 to be described later is disposed in the through-hole 342a.

The spin chuck 342 includes a body portion 3421 and an extension portion 3422 extending upwardly from the body portion 3421. The body portion 3421 and the extension portion 3422 are integrally formed. The through-hole 342a is formed to pass through both the body portion 3421 and the extension portion 3422. The body portion 3421 is formed to have the same area. The body portion 3421 is formed to have the same inner diameter. The through-hole 342a in the body portion 3421 is formed to have the same diameter. The extension portion 3422 is formed to gradually increase in area from the body portion 3421 in the upper direction. The inner diameter of the extension portion 3422 is formed to increase in the upper direction. The through-hole 342a in the extension portion 3422 is formed to increase in diameter in the upper direction. The heating unit 500 to be described later is disposed inside the body 3421, and a laser beam generated from the heating unit 500 is emitted to the substrate W through the extension portion 3422. The extension 3422 may be formed in a size that does not interfere with the laser beam. Through this, the laser beam generated by the heating unit 500 may be emitted to the substrate W without being interfered by the spin chuck 342. The spin chuck 342 may be disposed under the window member 348 to be described later. The spin chuck 342 supports the edge region of the window member 348. A connection portion between the spin chuck 342 and the window member 348 may have a sealing structure so that the chemical liquid supplied to the substrate W does not penetrate into the heating unit 500.

The window member 348 is located under the substrate W. The window member 348 is provided under the substrate W supported on the chuck pin 346. The window member 348 may be provided in a shape substantially corresponding to the substrate W. For example, when the substrate W is a circular wafer, the window member 348 may be provided in a substantially circular shape. The window member 348 may have a larger diameter than the substrate. However, the present invention is not limited thereto, and the window member 348 may have the same diameter as that of the substrate W or may be formed to have a smaller diameter than that of the substrate W. A hole 3481 in which the chuck pin 346 is disposed is formed in the window member 348. The chuck pin 346 may pass through the hole 3481 of the window member 348. A diameter of the hole 3481 of the window member 348 may be larger than a diameter of the chuck pin 346. Through this, the chuck pin 346 may move in the inside of the hole 3481 of the window member 348. At this time, the chuck pin 346 is moved in a direction perpendicular to the rotation axis direction of the spin chuck 342.

The window member 348 may be made of a material having high light transmittance. Accordingly, the laser beam emitted from the beam emitting unit 400 may pass through the window member 348. The window member 348 may be made of a material having excellent corrosion resistance so as not to react with the chemical liquid. For this purpose, the material of the window member 348 may be, for example, quartz, glass, or sapphire. The window member 348 is a configuration that allows the laser beam to pass through and reaches the substrate W, and protects the configuration of the substrate support member 340 from a chemical liquid, and may be provided in various sizes and shapes according to design.

A support pin 347 may be coupled to the window member 348. A plurality of support pins 347 may be provided. The support pin 347 may be provided in an edge region of the window member 348. The plurality of support pins 347 may be disposed to be spaced apart from each other along the edge region of the window member 348. The support pin 347 may be provided to protrude upwardly from the upper surface of the window member 348. The support pin 347 may support the lower surface of the substrate W to separate the substrate W from the window member 348.

The driving member 349 is coupled to the spin chuck 342. The driving member 349 rotates the spin chuck 342. Any driving member 349 may be used as long as the driving member 349 is capable of rotating the spin chuck 342. For example, the driving member 349 may be provided in a hollow motor. According to the exemplary embodiment, the driving member 349 may include a stator (not illustrated) and a rotor (not illustrated). The stator may be provided fixed at one position, and the rotor may be coupled to the spin chuck 342. The rotor may be coupled to the bottom of the spin chuck 349 to rotate the spin chuck 342. When a hollow motor is used as the driving member 349, the narrower the bottom of the spin chuck 349 is provided, the smaller the hollow of the hollow motor can be selected, thereby reducing the manufacturing cost. According to the exemplary embodiment, a cover member (not illustrated) for protecting the driving member 349 from the chemical liquid may be further included.

The chuck pin 346 is installed on the spin chuck 342. The chuck pin 346 is installed on the extension portion 3422 of the spin chuck 342. The chuck pin 346 rotates with the spin chuck 342. A plurality of chuck pins 346 is provided. The plurality of chuck pins 346 is spaced apart from each other. The plurality of chuck pins 346 may be arranged in a circular shape when combined. The plurality of chuck pins 346 is provided along the edge of the through-hole 342a formed in the extension portion 3422. The chuck pin 346 supports the side portion of the substrate W. The chuck pin 346 grips the substrate W. The chuck pin 3446 separates the substrate W from the window member 348 by a predetermined distance. At least a portion of the chuck pin 346 is received in the hole 3481 of the window member 348. The chuck pin 346 is provided movably inside the hole 3481 of the window member 348. The chuck pin 346 is coupled to the chuck pin moving unit 400 to be described later. The chuck pin 346 is provided to be movable by the chuck pin moving unit 400. The chuck pin 342 is provided to be movable between a contact position in which the chuck pin 342 is in contact with the side portion of the substrate W and an open position in which the chuck pin 342 is spaced apart from the side portion of the substrate W.

Referring to FIG. 3, the chuck pin moving unit 400 is coupled to one end of the chuck pin 346 to move the chuck pin 346. The chuck pin moving unit 400 moves the chuck pin 346 in a direction perpendicular to the rotation axis direction of the spin chuck 342. The chuck pin moving unit 400 moves the chuck pin 346 to move between the contact position in which the chuck pin 342 is in contact with the side portion of the substrate W and the open position in which the chuck pin 342 is spaced apart from the side portion of the substrate W. The chuck pin moving unit 400 moves the chuck pin 342 while the spin chuck 342 is rotating. The chuck pin moving unit 400 moves the chuck pin 342 while the substrate W rotates.

The chuck pin moving unit 400 includes a first driving module 420 and a second driving module 440. The first driving module 420 and the second driving module 440 are combined to move the chuck pin 346.

The first driving module 420 is coupled to the chuck pin 346. The first driving module 420 is accommodated in the spin chuck 432. The first driving module 420 is accommodated in the extension portion 3422 of the spin chuck 342. An accommodating space in which the first driving module 420 is accommodated is formed inside the extension portion 3422. The accommodation space inside the extension 3422 may be provided as a groove. The first driving module 420 is rotated together with the spin chuck 432.

The first driving module 420 includes a first magnetic body 422 and an arm member 424. The first magnetic body 420 is provided as a permanent magnet. The first magnetic body 422 faces a second magnetic body 442 of the second driving module 440 to be described later. The first magnetic body 422 is spaced apart from the second magnetic body 442. The first magnetic body 422 overlaps at least a portion of the second magnetic body 422 in the direction of the rotation axis of the spin chuck 342. The first magnetic body 422 and the second magnetic body 442 are provided so that the same polarities are opposite to each other. The polarity provided on the lower portion of the first magnetic body 422 has the same polarity as the polarity provided on the upper portion of the first magnetic body 442. For example, when the N polarity is disposed on the lower portion of the first magnetic body 422, the N polarity is disposed on the upper portion of the second magnetic body 442, and when the S polarity is disposed on the lower portion of the first magnetic body 422, the S polarity is disposed on the upper portion of the second magnetic body 442. Repulsive force acts between the first magnetic body 422 and the second magnetic body 442. The first magnetic body 422 is moved in the direction of the rotation axis of the spin chuck 342 by the repulsive force with the second magnetic body 442.

The arm member 424 connects the chuck pin 346 and the first magnetic body 422. One end of the arm member 424 is coupled to the chuck pin 346, and the other end of the arm member 424 is coupled to the first magnetic body 422. The arm member 424 guides the movement of the chuck pin 342 as the first magnetic body 422 moves by the repulsive force with the second magnetic body 422.

The arm member 424 may include a first arm 4242, a second arm 4244, and a third arm 4246. The first arm 4242 is coupled to the chuck pin 346. One end of the first arm 4242 is coupled to the chuck pin 345, and the other end of the first arm 4242 is coupled to the second arm 4244. The first arm 4242 extends in a direction perpendicular to the longitudinal direction of the chuck pin 346. The first arm 4242 is disposed inside the chuck pin 346.

The second arm 4244 connects the first arm 4242 and the third arm 4246. The second arm 4244 has one end coupled to the first arm 4242 and the other end coupled to the third arm 4246. One end of the second arm 4244 is coupled to the other end of the first arm 4242. The second arm 4244 may have a bent shape. The second arm 4244 has a first portion having a longitudinal direction corresponding to the longitudinal direction of the chuck pin 3446 and coupled to the first arm 4242, a second portion extending from the first portion and extending in a direction perpendicular to the longitudinal direction of the chuck pin 3446, and a bent portion connecting the first portion and the second portion. A hinge coupling portion hinge-coupled to the third arm 4246 may be provided on the second portion of the second arm 4244.

The third arm 4246 connects the second arm 4244 and the first magnetic body 422. One end of the third arm 4246 is hinge-coupled to the second arm 4244, and the other end of the third arm 4246 is hinge-coupled to the first magnetic body 422. One end of the third arm 4246 is hinged to a hinge coupling portion provided on the second portion of the second arm 4244.

The second arm 4244 may be provided with an elastic member 426. The elastic member 426 is elastically coupled to the second portion of the second arm 4244. The elastic member 426 is provided between the end of the second arm 4244 and the inner wall of the spin chuck 342. The elastic member 426 provides recovery force so that the chuck pin 346 moves from the open position to the contact position.

The second driving module 440 is spaced apart from the first driving module 420. The second driving module 440 does not come into contact with the first driving module 420. The second driving module 440 faces the first driving module 420. A partition wall is positioned between the second driving module 440 and the first driving module 420. The partition wall may be a bottom wall of the spin chuck 342. The partition wall may be a bottom wall of the extension part 3422 in which the first driving module 420 is accommodated. The downward movement of the first magnetic body 422 of the first driving module 420 is restricted by the partition wall. The upward movement of the second magnetic body 442 of the second driving module 440 is restricted by the partition wall. The second driving module 440 is provided outside the spin chuck 342. The second driving module 440 does not rotate together with the spin chuck 342.

The second driving module 440 includes a second magnetic body 442 and a driver 444. The second magnetic body 442 faces the first magnetic body 422. The second magnetic body 442 faces the first magnetic body 422. The second magnetic body 442 is spaced apart from the first magnetic body 422 by a predetermined distance. The second magnetic body 442 is provided as a permanent magnet. The second magnetic body 442 is provided to have a polarity opposite to that of the first magnetic body 422. For example, when the N polarity is disposed on the upper portion of the second magnetic body 442, the N polarity is disposed on the lower portion of the first magnetic body 422, and when the S polarity is disposed on the upper portion of the second magnetic body 442, the S polarity is disposed on the lower portion of the first magnetic body 422. Repulsive force acts between the second magnetic body 442 and the first magnetic body 422. Referring to FIG. 4, the second magnetic body 442 is provided in a ring shape.

The driver 444 moves the second magnetic body 442. The driver 444 moves the second magnetic body 442 in the direction of the rotation axis of the spin chuck 342. The driver 444 moves the second magnetic body 442 in the vertical direction along the rotation axis direction of the spin chuck 342. The driver 444 may be provided as any one of a cylinder, a stepping motor, a servo motor, and a solenoid coil. However, the present invention is not limited thereto, and any driving device capable of moving the second magnetic body 442 in the vertical direction may be applied.

A plurality of first driving modules 420 may be provided. The first driving module 420 may be provided in the same number as that of the chuck pins 346. One second driving module 440 may be provided.

The first driving module 420 moves the position of the chuck pin 346 according to the change in the position of the second magnetic body 442. Hereinafter, a process of moving the chuck pin 346 through the first and second driving modules 420 and 440 will be described.

Referring to FIGS. 5 and 6, the chuck pin 346 may be moved from the contact position in which the chuck pin 346 is in contact with the side portion of the substrate W to the open position in which the chuck pin 346 is spaced apart from the side portion of the substrate W. The driver 444 moves the second magnetic body 442 in an upward direction. When the second magnetic body 442 is moved upwardly, the spaced distance between the first magnetic body 422 and the second magnetic body 442 (hereinafter, a first gap d1) becomes narrower. When the first gap d1 between the first magnetic body 422 and the second magnetic body 442 is narrowed to a predetermined gap (hereinafter, a second gap d2), repulsive force is generated between the first magnetic body 422 and the second magnetic body 442. The first gap d1 is a distance at which repulsive force is not generated between the first magnetic body 422 and the second magnetic body 442 which face each other, and the second gap d2 means the distance in which repulsive force acts between the first magnetic body 422 and the second magnetic body 442. The second gap d2 may be greater than the first gap d1. When repulsive force acts between the first magnetic body 422 and the second magnetic body 442, the first magnetic body 422 moves upwardly by the repulsive force. When the first magnetic body 422 is moved upwardly, the other end of the third arm 4246 hinge-coupled with the first magnetic body 422 is moved upwardly, and one end of the third arm 4246 coupled to the second arm 4244 is moved in a direction away from the central axis of the spin chuck 342 (outward direction). At this time, the elastic member 426 is compressed in a direction away from the central axis of the spin chuck 346. As the third arm 4246 moves in the outward direction, the second arm 4244 also moves in the outward direction, and the first arm 4242 coupled to the second arm 4244 also moves in the outward direction to move the chuck pin 346 to the open position.

Referring to FIGS. 5 and 7, the chuck pin 346 may be moved from an open position spaced apart from the side portion of the substrate W to a contact position in which the chuck pin 346 is in contact with the side portion of the substrate W. The driver 444 moves the second magnetic body 442 in a downward direction. As the second magnetic body 442 moves downward, the first magnetic body 422 and the second magnetic body 442 are spaced apart from each other by a first distance d1 or more. In this case, the repulsive force between the first magnetic body 422 and the second magnetic body 442 does not act. When the repulsive force between the first magnetic body 422 and the second magnetic body 442 is extinguished, the first magnetic body 422 is no longer moved upward, the second arm 4244 is moved in a direction (inward direction) toward the central axis of the spin chuck 342 by the restoring force of the elastic member 426, and the first arm 4242 coupled to the second arm 4244 is also moved inward, so that the chuck pin 346 is moved to the contact position to grip the side portion of the substrate W. In addition, when the second arm 4244 is moved inwardly by the restoring force of the elastic member 426, one end of the third arm 4246 hinged with the second arm 4244 is moved inwardly, and the other end of the third arm 4246 hinged with the second magnetic body 442 is moved downwardly. The movement of the first magnetic body 422 in the downward direction is restricted by the partition wall positioned between the first magnetic body 422 and the second magnetic body 424.

Referring back to FIG. 2, the substrate treating apparatus 300 includes a heating unit 500. The heating unit 500 is a configuration for emitting a laser beam to the substrate W. The heating unit 500 may be positioned at a lower surface than the window member 348 in the substrate support unit 340. The heating unit 500 may emit a laser beam toward the substrate W positioned on the substrate support unit 340. The laser beam emitted from the heating unit 500 may pass through the window member 348 of the substrate support unit 340 to be emitted onto the substrate W. Accordingly, the substrate W may be heated to a set temperature. The heating unit 500 may include a laser beam generating member (not illustrated), a laser beam emitting member 500, and a laser beam transmitting member. The laser beam generating member (not illustrated) may be disposed outside the chamber 310. The laser beam emitting member 500 may include, for example, a lens. The laser beam emitting member 500 may include a plurality of lenses. The laser beam emitting member 500 may be provided inside the spin chuck 342. The laser beam emitting member may be provided as a line connecting the laser beam generating member (not illustrated) and the laser beam emitting member 500. The laser beam transmitting member may transmit the laser beam generated from the laser beam generating member (not illustrated) to the laser beam emitting member 500. The laser beam emitting member 500 receiving the laser beam by the laser beam transmitting member may emit the laser beam to the substrate W. In the above, the heating unit 500 has been described as a configuration for emitting a laser beam, but the present invention is not limited thereto, and the heating unit 500 may be provided as a variety of heat sources capable of heating the substrate W. For example, the heating unit 500 may be provided as an LED or a halogen heater.

Figure 9:
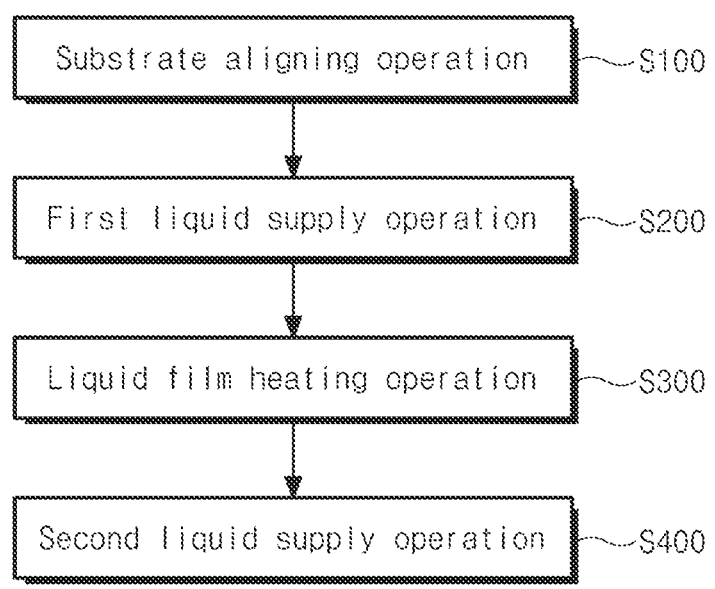
FIG. 9 is a flowchart of a substrate treating method according to an exemplary embodiment of the present invention.

Hereinafter, a substrate treating method according to an exemplary embodiment of the present invention will be described with reference to FIGS. 9 to 14. FIG. 9 is a flowchart of a substrate treating method according to an exemplary embodiment of the present invention, and FIGS. 10 to 13 are diagrams sequentially illustrating the substrate treating method of FIG. 9.

Figure 10:
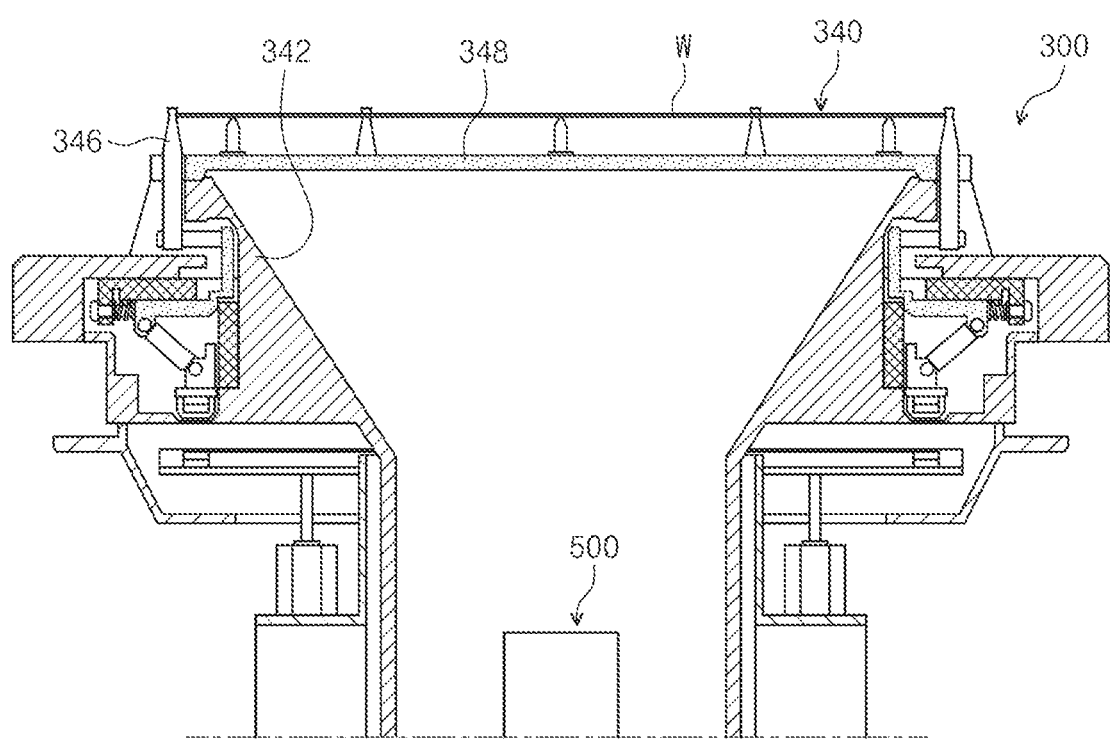
FIGS. 10 to 13 are diagrams sequentially illustrating the substrate treating method of FIG. 9.

FIG. 10 is a diagram illustrating an alignment operation of a substrate before starting a process according to the substrate treating method according to the exemplary embodiment of the present invention. Referring to FIG. 10, before the process starts, the substrate W is transferred to the substrate support unit 340. After the substrate W is transferred to the upper portion of the spin chuck 342, the center of the substrate W is aligned with the center of the spin chuck 342 or the window member 348. In this case, the chuck pin 346 is positioned at the open position. When the center of the substrate W is aligned with the center of the spin chuck 342 or the window member 348, the chuck pin 346 is moved to the contact position to support the side portion of the substrate W. In this case, the chuck pin 346 is moved by the chuck pin moving unit 400.

Figure 11:
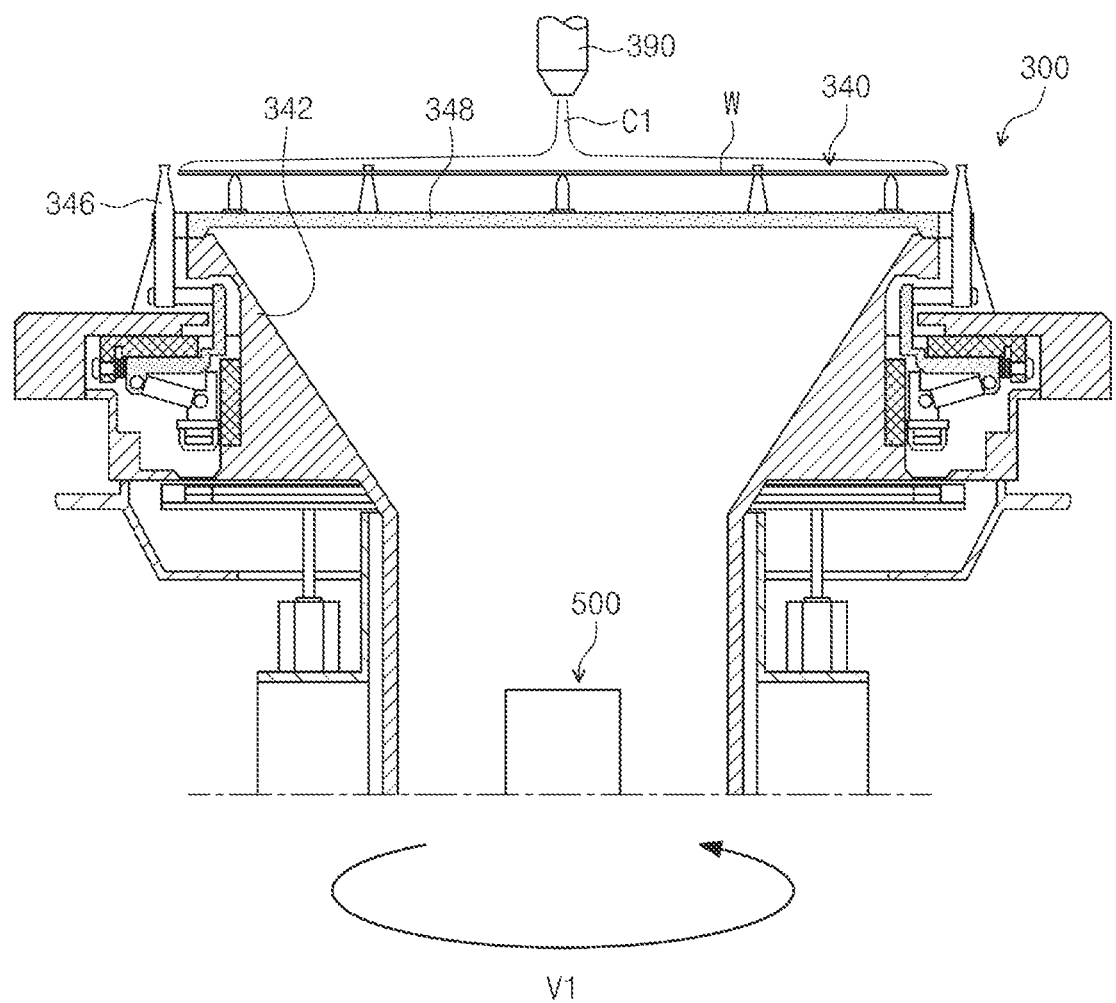

FIG. 11 illustrates a process of forming a processing liquid puddle on the substrate according to the substrate treating method according to the exemplary embodiment of the present invention. Referring to FIG. 11, the spin chuck 342 rotates the substrate W at a first speed in the state where the substrate W is supported by the chuck pins 346 of the substrate support unit 340. The liquid supply unit 390 forms a first liquid film C1 on the upper surface of the substrate W by supplying a first liquid to the substrate W rotating at the first speed. The first liquid film C1 may be a puddle having a predetermined thickness. When the first liquid is supplied to the substrate W, the chuck pin 346 is positioned at the open position. That is, the first liquid film C1 is formed by supplying the first liquid to the substrate W rotating at the first speed in the stat e where the chuck pin 346 is positioned at the open position in which the chuck pin 346 is spaced apart from the side portion of the substrate W. When the chuck pin 346 is positioned at a contact position in contact with the side of the substrate W when the first liquid film is formed, there is a problem in that the first liquid flows down along the chuck pin 346 and it is difficult to maintain a certain amount of the liquid film. However, according to the substrate treating method according to the exemplary embodiment of the present invention, when the first liquid film C1 is formed, the first liquid film C1 is formed in the state in which the chuck pin 346 is positioned at the open position in which the chuck pin 346 is spaced apart from the side portion of the substrate W, so that it is possible to prevent the flow-down phenomenon of the first liquid, thereby maintaining a certain amount of the liquid film. In addition, as the chuck pin 346 is spaced apart from the side portion of the substrate W, there is an advantage in that the first liquid film (puddle) may be easily formed by the surface tension of the first liquid film C1.

Figure 12:
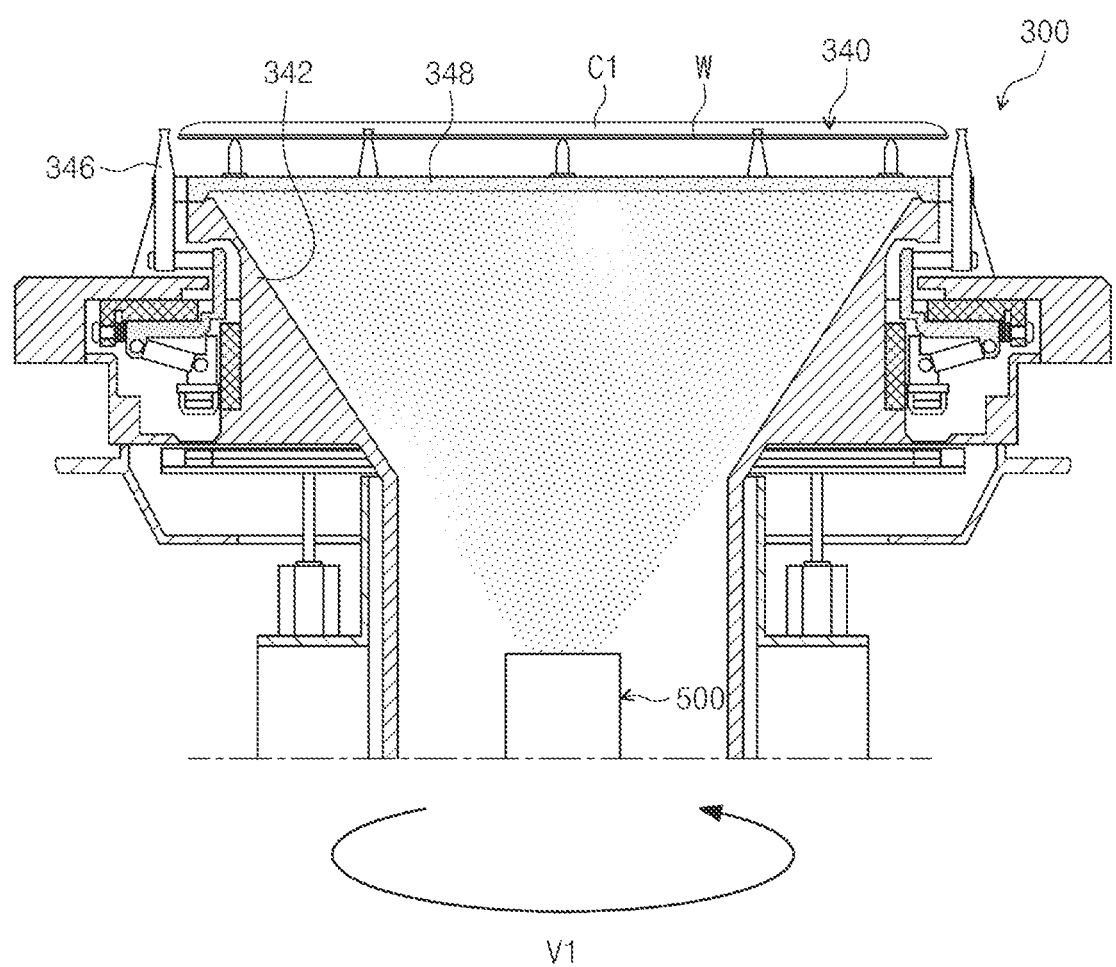

FIG. 12 is a diagram illustrating an operation of heating the first liquid film according to the substrate treating method according to the exemplary embodiment of the present invention. Referring to FIG. 12, when the first liquid film having a predetermined thickness is formed, the rotation of the substrate W is stopped and the supply of the first liquid from the liquid supply unit 390 is stopped. As a result, the surface of the substrate W is covered with the first liquid film C (formation of the puddle of the processing liquid). Here, the processing liquid may be provided as an aqueous solution of phosphoric acid. The substrate W and the first liquid film C1 are heated to a temperature suitable for processing the substrate W. The substrate W and the first liquid film C1 may be heated by the heating unit 500. At this time, the chuck pin 346 is located at the open position. As a heat source of the heating unit 500, any one of a laser, an LED, and a halogen heater may be provided. By maintaining the state in which the surface of the substrate W is covered with the first liquid film C1 of the heated processing liquid for a predetermined period of time, the treatment of the substrate W (for example, etching processing (wet etching process)) is performed. At this time, the spin chuck 342 rotates the substrate W at the first speed. The first liquid on the substrate W may be stirred by rotating the substrate W about half rotation in the forward rotation and reverse rotation direction. Thereby, etching is facilitated, and the in-plane uniformity of etching amount may be improved.

Figure 13:
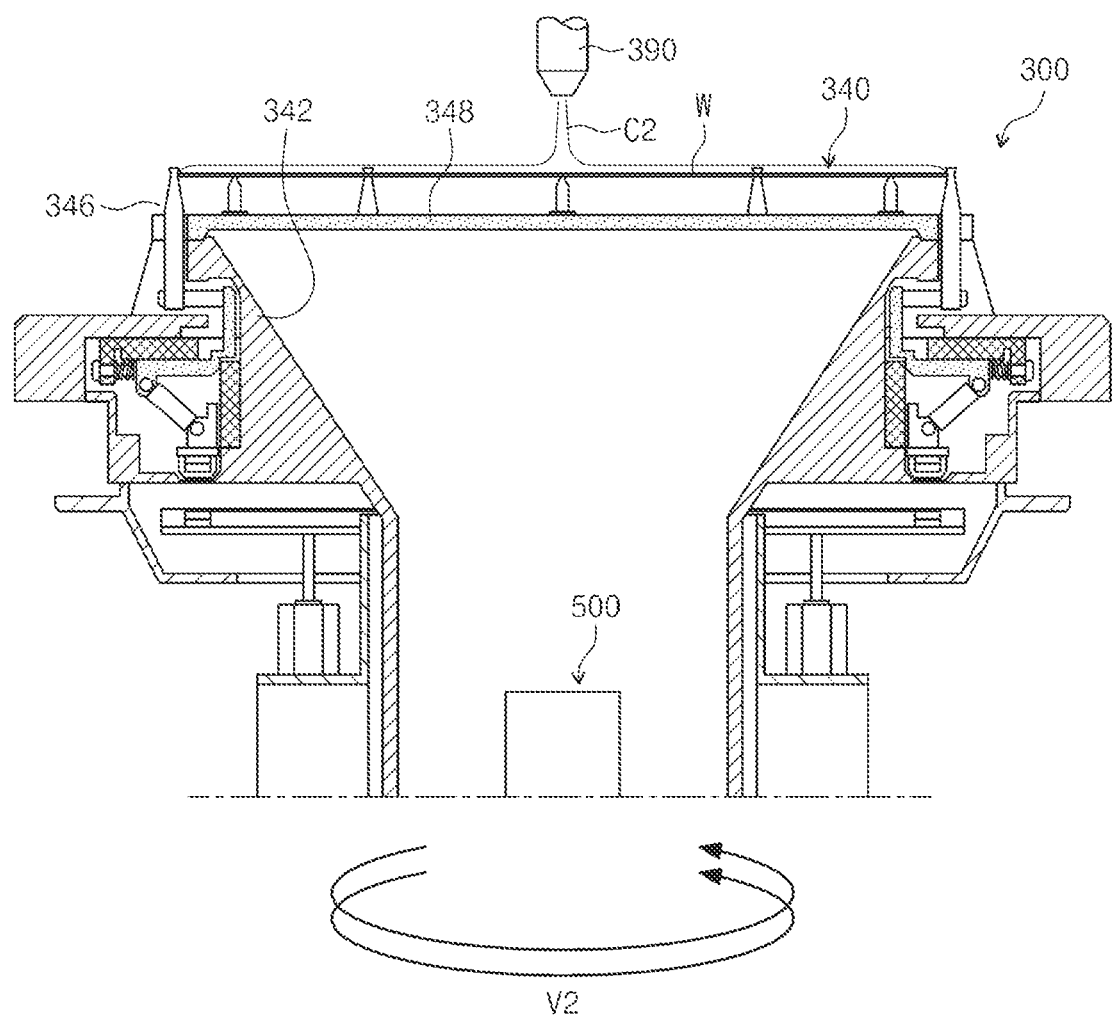

FIG. 13 is a diagram illustrating a second liquid supply operation according to the exemplary embodiment of the present invention. Referring to FIG. 13, after the first liquid film C1 is heated, a second liquid is supplied to the substrate W to form a second liquid film C2. In this case, the spin chuck 346 rotates the substrate W at a second speed. In addition, the chuck pin moving unit 400 moves the chuck pin 346 to the contact position in which the chuck pin 346 is in contact with the side portion of the substrate W. The second liquid may be provided in the same liquid as the first liquid. The second liquid may be provided as an aqueous solution of phosphoric acid. The thickness of the second liquid film C2 may be smaller than the thickness of the first liquid film C1. The second speed may be faster than the first speed. For example, the rotation at the first speed may be a low-speed rotation, and the rotation at the second speed may be a high-speed rotation. For example, the first speed may be equal to or less than 20 RPM.

The substrate treatment according to FIGS. 10 to 13 may be repeatedly performed a plurality of times. When the substrate treatment according to FIGS. 10 to 13 is finished, rinse processing (rinsing process) of supplying a rinse liquid to the substrate W to remove by-products generated by reaction with the processing liquid from the surface of the substrate W is performed. The rinse liquid may be pure water (DIW).

According to the substrate treating method according to the exemplary embodiment of the present invention, in the first liquid supply operation and the liquid film heating operation, the chuck pin 346 is moved so that the chuck pin 346 is positioned at the open position, and in the second liquid supply operation, the chuck pin 346 is moved so that the chuck pin 346 is positioned at the contact position. At this time, according to the general spin chuck structure of moving the chuck pin between the open position and the contact position by using a rotary cylinder that can rotate 90 degrees, the chuck pin is movable only when the spin chuck is stopped. Therefore, when the spin chuck has to be stopped and the chuck pin has to be moved whenever each operation of the substrate treating method is performed, the process takes a long time and the process efficiency is degraded, and when the spin chuck is stopped for the stop of the spin chuck and the movement of the chuck pin at each process operation, a liquid film having a uniform thickness may not be obtained, or the liquid film may be excessively hardened, causing the liquid film to break. In addition, when the treatment the substrate progresses in a state in which the chuck pin is in contact with the side portion of the substrate without stopping the spin chuck at each operation of the substrate treating method in the spin chuck structure in the related art, as described above, there are problems in that the liquid film flows along the surface of the chuck pin and thus a certain amount of liquid film cannot be formed, and since the surface tension of the liquid film is reduced by the contact area between the chuck pin and the side portion of the substrate, it is difficult to form a liquid film of a certain thickness.

However, according to the exemplary embodiment of the present invention, it is possible to move the chuck pin 346 even during the rotation of the spin chuck 342 through a chucking system utilizing the repulsive force of the rotating first magnetic body 422 and the non-rotating second magnetic body 442, which are spaced apart from each other, thereby solving the above-mentioned problems.

Meanwhile, the substrate treating apparatus and the substrate treating method according to the above-described exemplary embodiments may be controlled and performed by a controller (not illustrated). Configuration, storage and management of the controller may be realized in the form of hardware, software, or a combination of hardware and software. The file data and/or the software configuring the controller may be stored in volatile or non-volatile storage devices, such as Read Only Memory (ROM); or memory, such as, for example, Random Access Memory (RAM), memory chips, devices, or integrated circuits, or a storage medium, such as Compact Disk (CD), Digital Versatile Disc (DVD), magnetic disk, or magnetic tape, which are optically or magnetically recordable and simultaneously machine (for example, computer)-readable.

The foregoing detailed description illustrates the present invention. In addition, the foregoing is intended to describe exemplary or various exemplary embodiments for implementing the technical spirit of the present invention, and the present invention may be used in various other combinations, changes, and environments. That is, the foregoing content may be modified or corrected within the scope of the concept of the invention disclosed in the present specification, the scope equivalent to that of the disclosure, and/or the scope of the skill or knowledge in the art. Accordingly, the detailed description of the invention above is not intended to limit the invention to the disclosed exemplary embodiment. In addition, the appended claims should be construed to include other exemplary embodiments as well. Such modified exemplary embodiments should not be separately understood from the technical spirit or prospects of the present invention.

What is claimed is:

1. An apparatus for treating a substrate, the apparatus comprising:
　a processing vessel having a processing space;
　a support unit configured to support the substrate in the processing space and rotate the substrate;
　a liquid supply unit configured to supply a processing liquid to the substrate supported by the support unit; and
　a heating unit configured to heat the substrate,
　wherein the support unit includes:
　　a spin chuck;
　　a driver configured to rotate the spin chuck;
　　a chuck pin installed on the spin chuck so as to be rotated together with the spin chuck;
　　a window member configured to be disposed under the substrate, wherein the window member includes a hole within which the chuck pin is disposed and wherein the window member is configured to be shaped to match a shape of the substrate; and
　　a chuck pin moving unit configured to move the chuck pin between a contact position in which the chuck pin is in contact with a side portion of the substrate and an open position in which the chuck pin is spaced apart from the side portion of the substrate,
　　wherein the chuck pin moving unit includes:
　　　a first driving module coupled to the chuck pin and rotated together with the spin chuck; and
　　　a second driving module which faces the first driving module and is not rotated together with the spin chuck,
　　wherein the first driving module includes:
　　　a first magnetic body; and
　　　an arm member connecting the first magnetic body and the chuck pin, wherein the arm member is configured to guide the movement of the chuck pin as the first magnetic body moves, and wherein the arm member includes:
　　　　a first arm coupled to the chuck pin and extending in a direction perpendicular to a longitudinal direction of the chuck pin;
　　　　a second arm coupled to the first arm; and
　　　　a third arm configured to connect the second arm and the first magnetic body,
　　　　wherein the third arm is hinge-coupled to each of the second arm and the first magnetic body,
　　　　wherein an elastic member is coupled to one end of the second arm, and
　　　　wherein the elastic member is configured to provide recovery force so that the chuck pin is moved from the open position to the contact position, wherein the second driving module includes a second magnetic body facing the first magnetic body, and a driving member configured to drive the second magnetic body in a vertical direction, and wherein a space where the second drive module is disposed and a space where the first magnetic body is disposed are separated from each other by a bottom of the spin chuck.

2. The apparatus of claim 1, wherein the first driving module moves a position of the chuck pin according to a change in a position of the second magnetic body.

3. The apparatus of claim 1, wherein a repulsive force acts between the first magnetic body and the second magnetic body.

4. The apparatus of claim 1, wherein the chuck pin includes a plurality of chuck pins, the second magnetic body is provided in a ring shape, and
the first driving module is provided in a number corresponding to the plurality of chuck pins.

5. The apparatus of claim 1, wherein the chuck pin moving unit moves the chuck pin while the spin chuck is rotating.

6. The apparatus of claim 5, wherein the driver rotates the spin chuck so that the substrate is rotated at a first speed, and the chuck pin moving unit moves the chuck pin so that the chuck pin is positioned at the open position while the substrate is rotating at the first speed.

7. The apparatus of claim 6, wherein the driver rotates the spin chuck so that the substrate is rotated at a second speed faster than the first speed, and the chuck pin moving unit moves the chuck pin so that the chuck pin is positioned at the contact position while the substrate is rotating at the second speed.

8. The apparatus of claim 1, wherein the spin chuck has a through-hole penetrating in a vertical direction, and the heating unit heats a bottom surface of the substrate through the through-hole.

9. The apparatus of claim 8, wherein the heating unit includes a laser.

10. The apparatus of claim 8, wherein the spin chuck includes:

a body portion; and
an extension portion extending upwardly from an upper end of the body portion,
wherein an area of the extension portion gradually increases toward the top.

* * * * *